(12) United States Patent
Martin et al.

(10) Patent No.: US 10,025,001 B2
(45) Date of Patent: Jul. 17, 2018

(54) OPTICAL SENSORS IN DOWNHOLE LOGGING TOOLS

(71) Applicant: Halliburton Energy Services, Inc., Houston, TX (US)

(72) Inventors: E. San Martin, Houston, TX (US); Etienne Marcel Samson, Cypress, TX (US); Burkay Donderici, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 169 days.

(21) Appl. No.: 15/038,121

(22) PCT Filed: Dec. 20, 2013

(86) PCT No.: PCT/US2013/076938
§ 371 (c)(1),
(2) Date: May 20, 2016

(87) PCT Pub. No.: WO2015/094343
PCT Pub. Date: Jun. 25, 2015

(65) Prior Publication Data
US 2016/0291199 A1 Oct. 6, 2016

(51) Int. Cl.
*G01V 5/00* (2006.01)
*G01V 8/16* (2006.01)
*G01R 33/032* (2006.01)
*G01R 33/26* (2006.01)

(52) U.S. Cl.
CPC ............ *G01V 8/16* (2013.01); *G01R 33/032* (2013.01); *G01R 33/26* (2013.01)

(58) Field of Classification Search
CPC .......... G01V 8/16; G01V 5/00–5/0069; G01R 33/36; G01R 33/032; G01R 33/26
USPC ...................................................... 250/253
See application file for complete search history.

(56) References Cited

U.S. PATENT DOCUMENTS

| | | |
|---|---|---|
| 4,848,906 A | 7/1989 | Layton |
| 5,392,117 A | 2/1995 | Belleville et al. |
| 5,691,837 A | 11/1997 | Itoh et al. |
| 5,767,669 A | 6/1998 | Hansen et al. |
| 7,743,661 B2 | 6/2010 | Berthold et al. |
| 7,782,465 B2 | 8/2010 | Gibler et al. |

(Continued)

FOREIGN PATENT DOCUMENTS

WO 2012144977 A1 10/2012

OTHER PUBLICATIONS

Humberto Campanella, R P Del Real, Marta Duch, Hector Guerrero, Juame Esteve, Marina Diaz-Michelena and Jose A Plaza, Comparative performance of static-mode ferrous MEMS gradiometers by a three-step DRIE process. published May 21, 2010. accessed online at http://stacks.iop.org/JMM/20/075006 on Apr. 30, 2012.

(Continued)

*Primary Examiner* — David Porta
*Assistant Examiner* — Meenakshi Sahu
(74) *Attorney, Agent, or Firm* — Howard L. Speight, PLLC.

(57) ABSTRACT

A downhole logging tool comprises an optical sensor to sense a field related to a formation parameter at a first location along the downhole logging tool. A processor receives information from the optical sensor and provides an evaluation of the formation parameter.

19 Claims, 9 Drawing Sheets

(56) References Cited

U.S. PATENT DOCUMENTS

| | | |
|---|---|---|
| 8,264,692 B2 | 9/2012 | Hall |
| 2002/0179623 A1 | 12/2002 | Geltser et al. |
| 2007/0097694 A1 | 5/2007 | Faase et al. |
| 2008/0085080 A1* | 4/2008 | Dimmick ............ G01K 11/3206 385/37 |
| 2009/0250213 A1* | 10/2009 | Kalb ................... E21B 47/0905 166/255.1 |
| 2010/0046002 A1 | 2/2010 | Perez et al. |
| 2011/0139447 A1* | 6/2011 | Ramos .................... E21B 47/09 166/254.2 |
| 2011/0210824 A1* | 9/2011 | Stewart ................ G06K 7/0008 340/10.1 |
| 2011/0297818 A1* | 12/2011 | Thornton ................. G01V 5/00 250/269.5 |
| 2011/0308789 A1 | 12/2011 | Zhang et al. |

OTHER PUBLICATIONS

International Preliminary Examining Authority, International Preliminary Report on Patentability, International Application No. PCT/US13/76938, which is a PCT parent of the instant application, dated Nov. 12, 2015.

International Searching Authority, The International Search Report and the Written Opinion, International Application No. PCT/US2013/076938, which is a PCT parent of the instant application, dated Apr. 14, 2014.

* cited by examiner

FIG. 1

Key:
[A] = Light Source
[B] = Light Processing Unit

OPTICAL SENSORS IN DOWNHOLE LOGGING TOOLS

BACKGROUND

Reservoir complexity in today's wells is much higher than in those that were drilled in the early years of oil production. This requires vast amount of data to be collected in very high temperature and high pressure environments to properly make drilling and production decisions. As a result, retrieving data from sensors in a downhole logging tool is a challenge.

DETAILED DESCRIPTION

Figure 1:
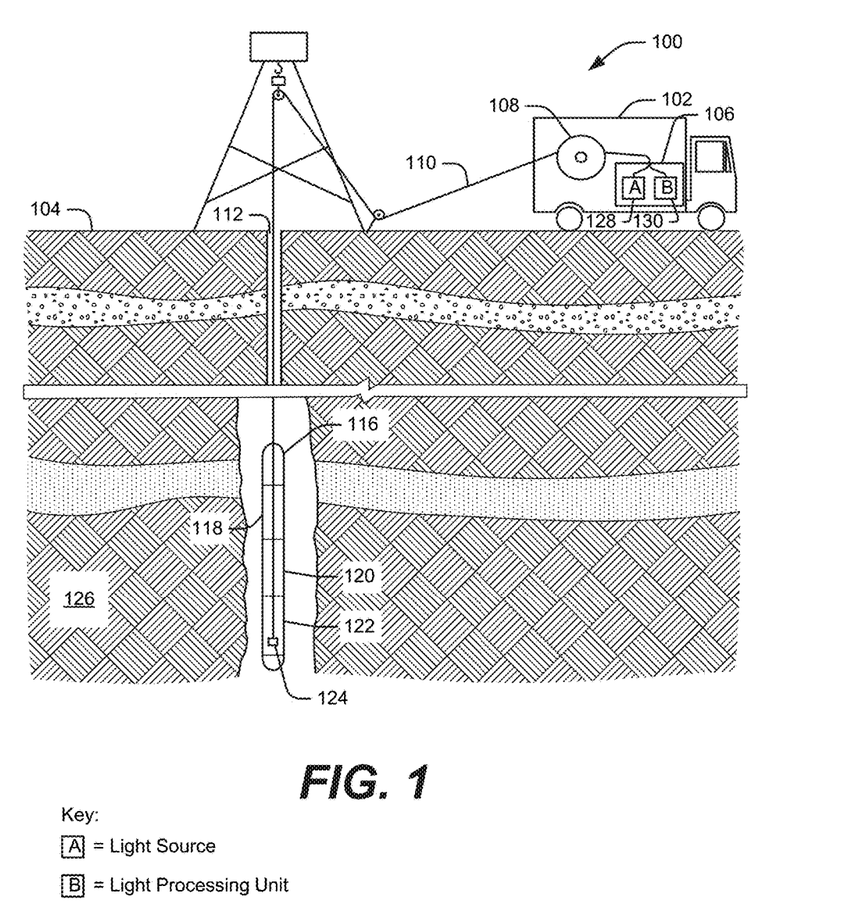
FIG. 1 illustrates a wireline or slickline well logging system environment.

In one embodiment of a wireline or slickline well logging system 100 (greatly simplified for illustration) at a well site, as depicted in FIG. 1, a logging truck or skid 102 on the earth's surface 104 houses a data gathering system 106 and a winch 108 from which a fiber optic cable 110 extends into a well bore 112. In one embodiment, the fiber optic cable 110 suspends a logging toolstring 116 within the well bore 112 to measure formation data as the logging tool 116 is raised or lowered by the wireline 110. In one embodiment, the logging toolstring 116 includes a first downhole logging tool 118, a second downhole logging tool 120, and a third downhole logging tool 122. In one embodiment, the third downhole logging tool 122 includes an optical sensor 124 that is used to take a measurement from a formation 126 that is adjacent to the logging tool 122. In one embodiment, the fiber optic cable 110 extends, as a single cable or in multiple segments coupled by optical couplers (not shown), from the data gathering system 106 to the optical sensor 124. In one embodiment, a light source 128 transmits a source light through the fiber optic cable 110 to the optical sensor 124. In one embodiment, the optical sensor 124 transmits a modified version of the source light through the fiber optic cable 110 to a processor 130, which processes the modified version of the source light to estimate a value of the parameter of the formation 126 from the measurement made by the optical sensor 124. In one embodiment, the fiber optic cable 110 includes a plurality of input fibers to carry light into the bore hole 112, a plurality of output fibers to carry light out of the bore hole 112, electrical cables to carry electrical signals in and out of the bore hole 112, and armoring to give it the strength necessary to bear the weight of the logging tool string 116.

In one embodiment, the light source 128 is located in the third downhole logging tool 122. In one embodiment, the processor 130 is located in the third downhole logging tool 122. In one embodiment the light source 128 and the processor 120 are located in the third downhole logging tool 122.

Figure 2:
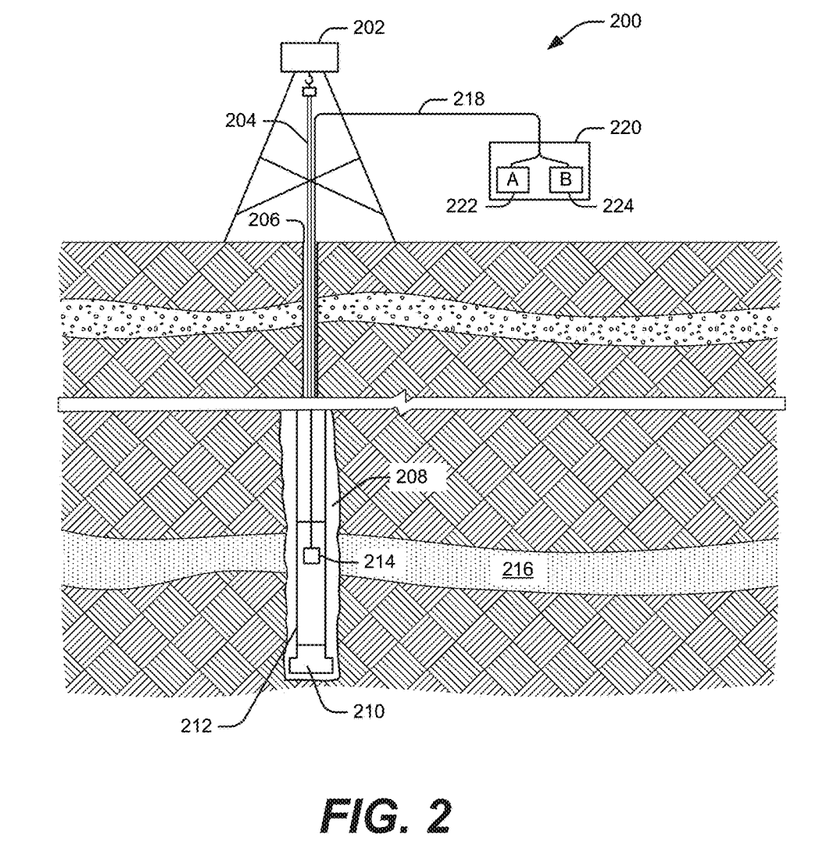
FIG. 2 illustrates a logging while drilling or measurement while drilling environment.

In one embodiment, a drilling system 200, depicted in FIG. 2 (greatly simplified for illustration and having different scales in the upper half and the lower half), includes a derrick 202 from which a drill string 204 is suspended in a well bore 206. While FIG. 2 shows a land-based drilling system, the equipment and techniques described herein are also useful in a sea-based drilling system. In one embodiment, the volume within the well bore 206 around the drill string 204 is called the annulus 208. In one embodiment, the drill string includes a bit 210 and a downhole logging tool 212. In one embodiment, the downhole logging tool 212 includes an optical sensor 214 that is used to take a measurement from a formation 216 adjacent to the downhole logging tool 212. In one embodiment, a fiber optic cable 218 extends, as a single cable or in multiple segments coupled by optical couplers (not shown), from a data gathering system 220 (which in one embodiment is the same as the data gathering system 106 shown in FIG. 1) to the optical sensor 214. In one embodiment, a light source 222 transmits a source light through the fiber optic cable 218 to the optical sensor 214. In one embodiment, the optical sensor 214 transmits a modified version of the source light through the fiber optic cable 218 to a processor 224, which processes the modified version of the source light to estimate a value of the parameter of the formation 216 from the measurement made by the optical sensor 214. In one embodiment, the fiber optic cable 218 includes a plurality of input fibers to carry light into the bore hole 206 and a plurality of output fibers to carry light out of the bore hole 206.

In one embodiment, the light source 222 is located in the downhole logging tool 212. In one embodiment, the processor 224 is located in the downhole logging tool 212. In one embodiment the light source 222 and the processor 224 are located in the downhole logging tool 212.

Figure 3:
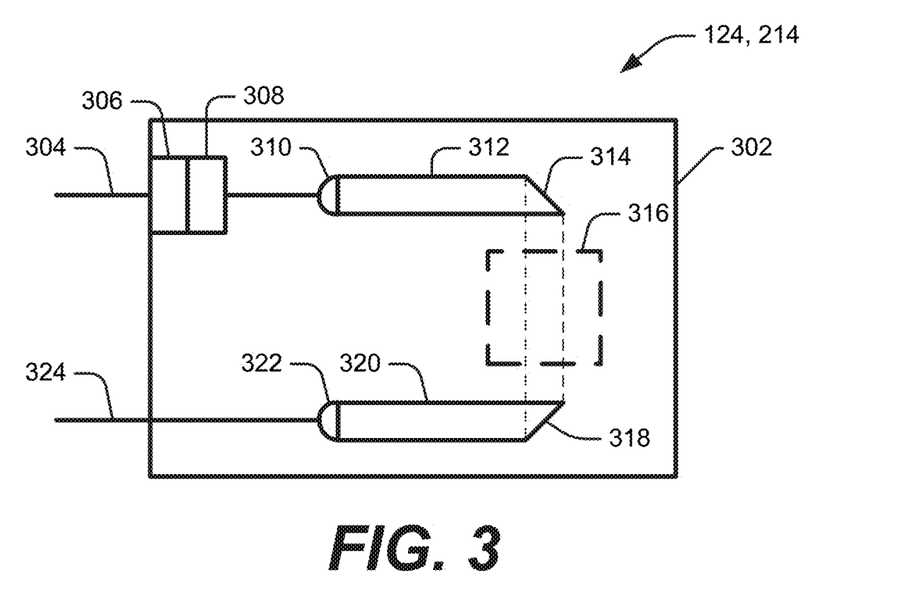
FIG. 3 is a block diagram of an optical sensor.

In one embodiment, illustrated in FIG. 3, the optical sensor 124, 214 includes an optical sensor housing 302. In one embodiment, light enters the optical sensor housing 302 by way of a single mode input fiber 304 and passes through a depolarizer 306, a polarizer 308, an input gradient index optics ("GRIN") lens 310, and an input light pipe 312 to an input mirror 314 where it is deflected through a sensing element 316 to an output mirror 318. In one embodiment, the output mirror 318 deflects the light through an output light pipe 320 and an output GRIN lens 322 to a single mode output fiber 324 by which it exits the optical sensor housing 302. In one embodiment, the single mode input fiber 304 and the single mode output filter 324 are coupled to the fiber optic cable 110, 218.

Figure 4:
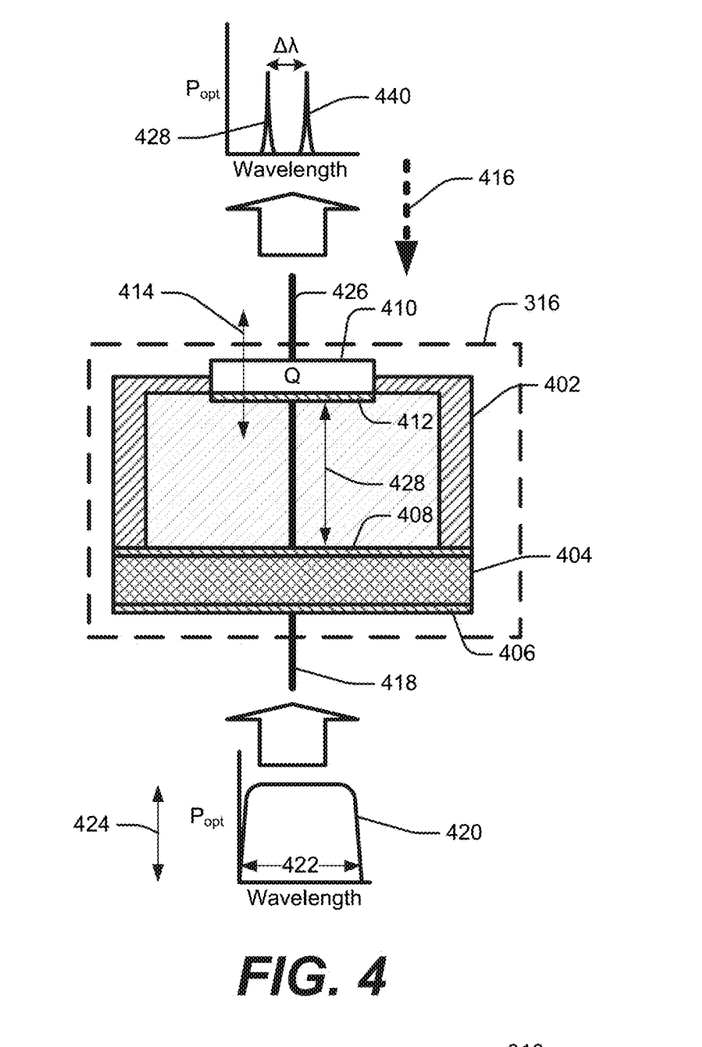
FIGS. 4-8 illustrate sensing elements.

In one embodiment, illustrated in FIG. 4, the sensing element 316 comprises sensing element housing 402. In one embodiment, the sensing element housing 402 houses a reference mirror 404. In one embodiment, the reference mirror 404 is coated by a first reference coating 406 and a second reference coating 408. In one embodiment, the reflectance of the first reference coating 406 and the second reference coating 408 is less than 100 percent.

In one embodiment, the sensing element housing 402 houses a charged electric plate 410, which carries a charge "Q." In one embodiment, the charged electric place 410 is coated on one side by an electric plate coating 412, which has a reflectance of less than 100 percent. In one embodiment, the charged electrical plate 410 moves in a direction 414 perpendicular to the surface of the electric plate 410 coated by the electric plate coating 412 in response to an electric field, represented by arrow 416.

In one embodiment, the second reference coating 408 and the electric plate coating 410 form a Fabry-Perot interferometer. In one embodiment, a portion of a source light 418, such as a laser beam or, more specifically, a broadband pulse 420, are reflected by the first reference coating 406. In one embodiment, the wavelength range of the broadband pulse 420 varies depending on convenient frequencies for the optical sensor 124, 214 or convenient frequencies for minimizing the attenuation of light in the fiber optic cable 110, 218. In one embodiment, a typical range of wavelength of light in optical fibers is 1.0-1.7 micro-meters, with minimal attenuation in the fibers around 1.5-1.6 micro-meters. In one embodiment, the typical optical power of the broadband pulse 420 is 10 µ Watts. In one embodiment, the typical pulse width is approximately 145 milliseconds. In one embodiment, a portion of the source light 418 passes through the first reference coating 406 and the second reference coating 408 and reflects repeatedly between the electric plate coating 410 and the second reference coating, with an output 426 (along with a portion of the original source light 418) escaping through the electric plate coating 410 with each reflection. In one embodiment, constructive and destructive interference among the reflections causes the output 426 to have a narrow frequency band (or spectrum) whose position in the frequency spectrum depends on the distance between the second reference coating 408 and the electric plate coating 412, which, in turn, depends on the strength of the electric field 416. Thus, in one embodiment, if there is no electric field 416 the output 426 will have the spectrum 428. In one embodiment, in the presence of an electric field 416, the output 426 will have the spectrum 440, where the peak has shifted by $\Delta\lambda$. In one embodiment, using this technique, the strength of the electric field 416 can be monitored.

Figure 5:
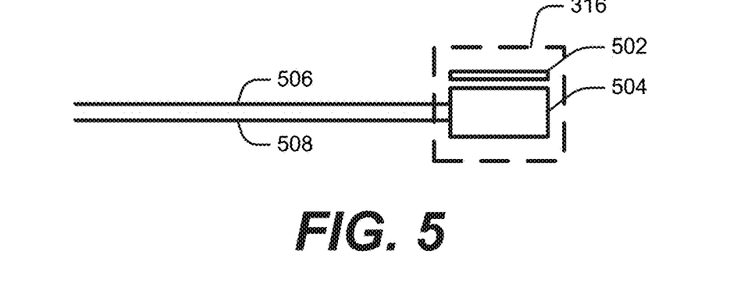

In one embodiment, illustrated in FIG. 5, the sensing element 316 is an atomic magnetometer including a quarter wave plate 502 and an alkali vapor cell 504. In one embodiment, the sensing element 316 includes an optional optical fiber for laser heating 506 and a temperature sensing fiber 508.

Figure 6:
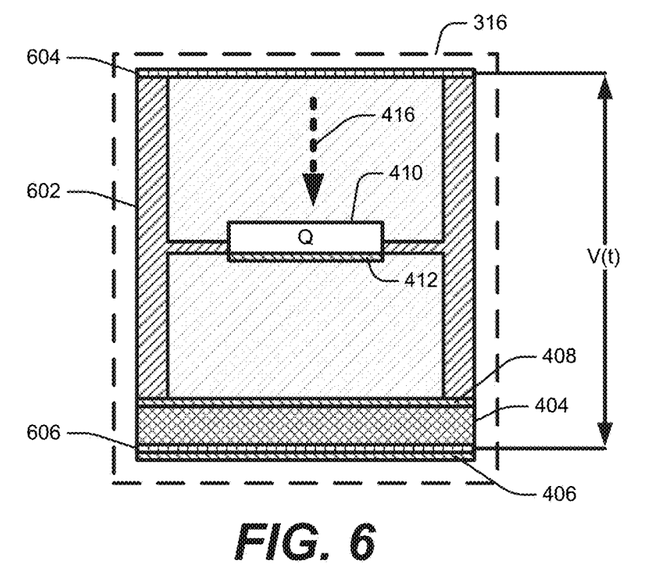
Figure 7:
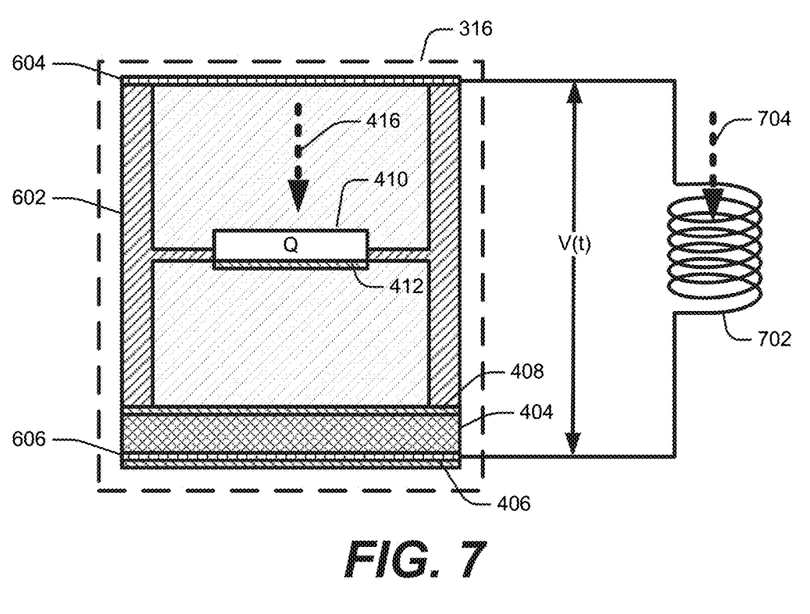
Figure 8:
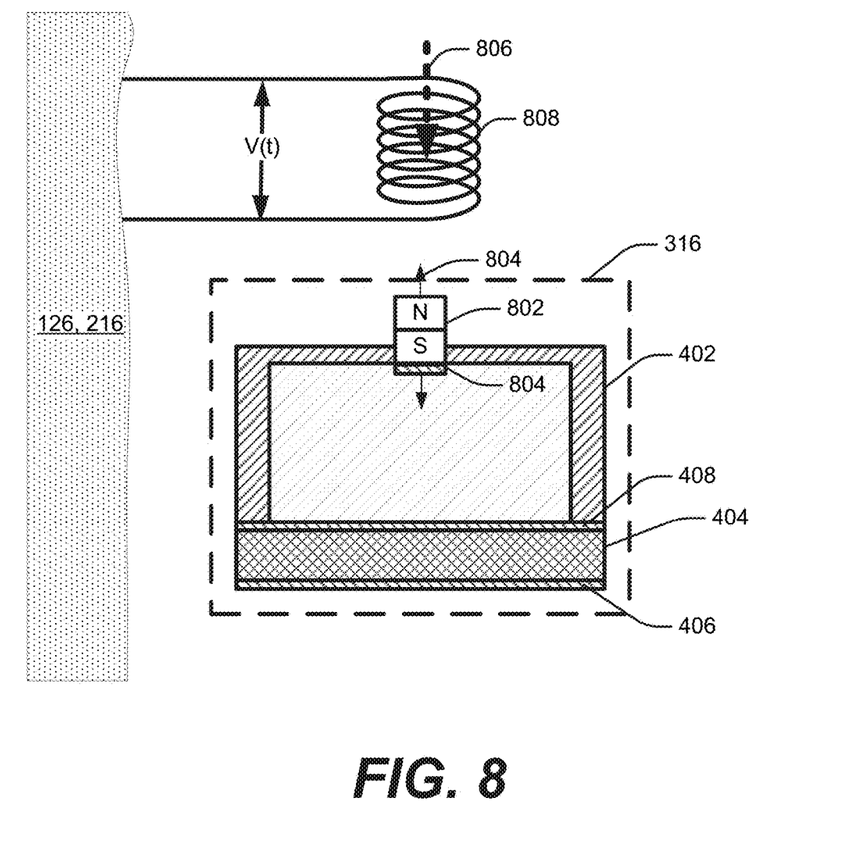

FIGS. 6-8 illustrate variations of the sensing element 316 illustrated in FIG. 4. In one embodiment, illustrated in FIG. 6, the sensing element 316 includes a housing 602 that is different from the sensing element housing 402 illustrated in FIG. 4. In one embodiment, the electric field 416 is generated by applying a voltage V(t) across two electrodes 604 and 606. In one embodiment, the voltage V(t) is applied from the formation 126, 216 or it is generated based on a measurement of a parameter in the formation 126, 216.

In one embodiment, illustrated in FIG. 7, which is similar to the embodiment shown in FIG. 6, an inductor 702 in the presence of a time varying magnetic field B(t) 704 generates the voltage V(t).

In one embodiment, illustrated in FIG. 8, which is similar to the embodiment shown in FIG. 4, the charged plate 410 is replaced by a magnet 802 whose position, represented in FIG. 8 by arrow 804, is influenced by a magnetic field 806 generated by an inductor 808 in response to a voltage V(t) measured in the formation 126, 216. In one embodiment, the magnet 802 has a reflective coating that performs the same function as the electric plate coating 412 in FIG. 4.

In one embodiment, multiple optical sensors 214 located at different positions along a light path, such as an optical fiber, each execute a separate measurement and modify a single wide band light pulse using frequency and time multiplexing. In one embodiment, for every measurement cycle one wide band light pulse is sent from the light source 128, 222. In one embodiment, the light that returns is processed by the processor 130, 224 to extract the measurements of all the optical sensors 214.

Figures 9, 10, 11:
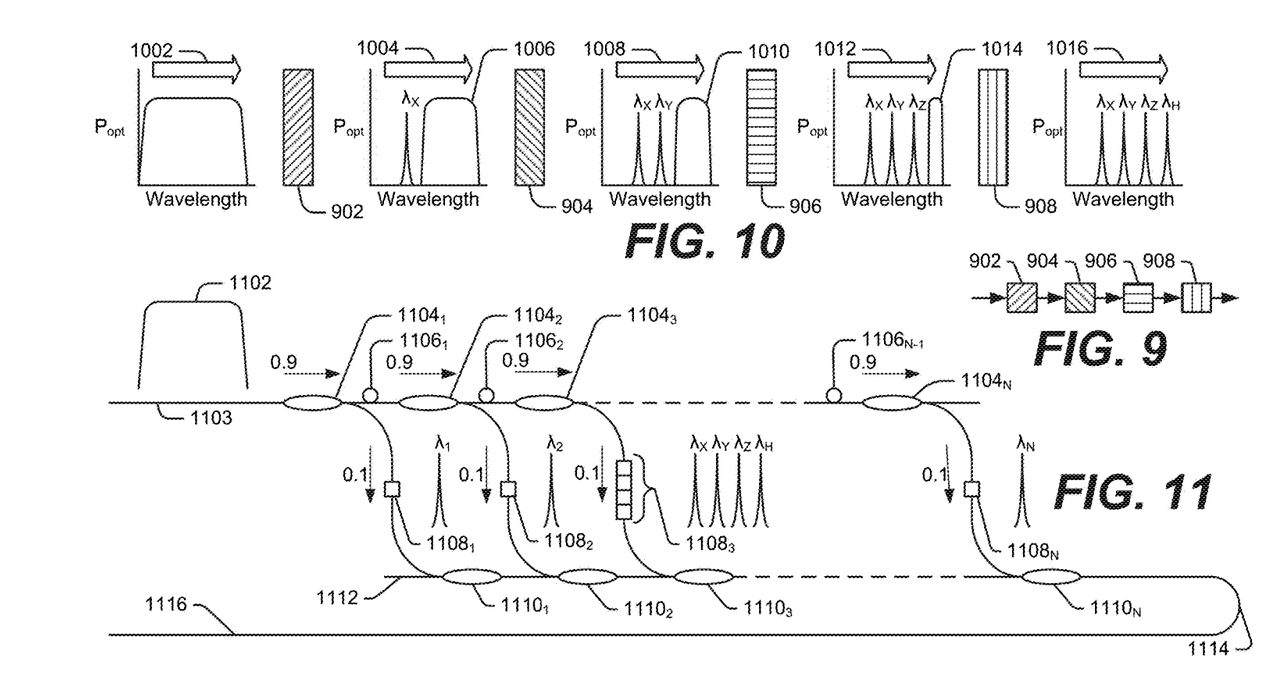
FIG. 9 illustrates serially connected optical sensors.
FIG. 10 illustrates frequency multiplexed optical sensors.
FIG. 11 illustrates time and frequency multiplexed optical sensors.

In one frequency multiplexing embodiment, illustrated in FIG. 9, four optical sensors, such as optical sensors 124, 214, are used. In one embodiment, light is transmitted from the light source 128, 222 to optical sensor 902. In one embodiment, light is transmitted from optical sensor 902 to optical sensor 904, to optical sensor 906, to optical sensor 908, and to other devices (not shown) and finally to the processor 130, 224 where the frequency multiplexed measurements are extracted and processed.

In another view of the frequency multiplexing embodiment of FIG. 9, illustrated in FIG. 10, a wide band light pulse represented by arrow 1002 and the wavelength versus optical power ($P_{opt}$) graph below arrow 1002, is transmitted from the light source 128, 122 to the optical sensor 902. In one embodiment, optical sensor 902 produces a filtered output pulse represented by arrow 1004 and the wavelength versus optical power graph below arrow 1004, which includes a narrow band output centered at frequency $\lambda_X$, whose frequency represents the measurement performed by optical sensor 902. In one embodiment, the filtered output pulse represented by arrow 1004 also includes a passed-through portion of the original wideband light pulse 1006.

In one embodiment, optical sensor 904 receives the light output by optical sensor 902 and produces a filtered output pulse represented by arrow 1008 and the wavelength versus optical power graph below arrow 1008, which includes the narrow band output at frequency $\lambda_X$ and a narrow band output centered at frequency $\lambda_Y$, whose frequency represents the measurement performed by optical sensor 904. In one embodiment, the filtered output pulse represented by arrow 1008 also includes a passed-through portion of the original wideband light pulse 1010.

In one embodiment, optical sensor 906 receives the light output by optical sensor 904 and produces a filtered output pulse represented by arrow 1012 and the wavelength versus optical power graph below arrow 1012, which includes the narrow band outputs at frequencies $\lambda_X$ and $\lambda_X$ and a narrow band output centered at frequency $\lambda_Z$, whose frequency represents the measurement performed by optical sensor 906. In one embodiment, the filtered output pulse represented by arrow 1012 also includes a passed-through portion of the original wideband light pulse 1014.

In one embodiment, optical sensor 908 receives the light output by optical sensor 906 and produces a filtered output pulse represented by arrow 1016 and the wavelength versus optical power graph below arrow 1016, which includes the narrow band outputs at frequencies $\lambda_X$, $\lambda_X$, and $\lambda_Z$, and a narrow band output centered at frequency $\lambda_H$, whose frequency represents the measurement performed by optical sensor 908. In one embodiment, the filtered output pulse represented by arrow 1012 also includes a passed-through portion of the original wideband light pulse 1002 (not shown).

As can be seen, the output of the final optical sensor 908 in the chain shown in FIG. 9 has frequency multiplexed representations of each of the measurements made by optical sensors 902, 904, 906 and 908.

In a frequency and time multiplexed embodiment, illustrated in FIG. 11, a wide band light pulse 1102 transmitted by the light source 128, 122 on an input fiber 1103 encounters a series of optical splitters $1104_{1...N}$, each of which transmits 90 percent of the light it receives to a succeeding optical splitter and 10 percent to a respective optical sensor, such as optical sensor 124, 214. In one embodiment, a time delay $1106_{1...N-1}$ is inserted between consecutive optical splitters $1104_{1...N}$. In one embodiment, each time delay $1106_{1...N-1}$ comprises a loop of fiber optic cable approximately 30 meters long, so that each $1106_{1...N-1}$ produces a delay of approximately $1.5 \times 10^{-8}$ seconds (30 meters/(speed of light/1.5)). In one embodiment, at least one of the time delays $1106_{1...N-1}$ has a different duration than the others (for example, by varying the length of the corresponding fiber optic cable), i.e., $1106_M \neq 1106_{1,...M-1,M+1,...,N-1}$.

In one embodiment, the 10 percent output of optical splitter $1104_1$ is directed to an optical sensor $1108_1$ which produces a narrow band output centered at frequency $\lambda_1$ representative of a measurement made by optical sensor $1108_1$. In one embodiment, that output is directed to an optical combiner $1110_1$, where it is combined with optical signals present on input 1112, if any.

In one embodiment, the 10 percent output of splitter $1104_2$ is directed to an optical sensor $1108_2$ which produces a narrow band output centered at frequency $\lambda_2$ representative of a measurement made by optical sensor $1108_2$. In one embodiment, that output is directed to an optical combiner $1110_2$, where it is combined with the output of optical combiner $1110_1$. The 10 percent output of optical splitter $1104_2$ is delayed by time delay $1106_1$, causing the $\lambda_2$ signal to be shifted in time relative to the $\lambda_1$ signal.

In one embodiment, the 10 percent output of optical splitter $1104_3$ is directed to series-coupled optical sensors $1108_3$ which are coupled together as shown in FIGS. 9 and 10 and produces frequency multiplexed narrow band outputs centered at frequencies $\lambda_X$, $\lambda_X$, $\lambda_Z$, and $\lambda_H$, representative of measurement made by optical sensors $1108_3$. In one embodiment, that output is directed to an optical combiner $1110_3$, where it is combined with the output of optical combiner $1110_2$. The 10 percent output of optical splitter $1104_3$ is delayed by time delay $1106_2$, causing the $\lambda_X$, $\lambda_X$, $\lambda_Z$, and $\lambda_H$, signal to be time multiplexed relative to the $\lambda_1$ signal and the $\lambda_2$ signal.

In one embodiment, optical splitters $1104_{4...N-2}$, optical sensors $1108_{4...N-1}$, and optical combiners $1110_{4...N-1}$ (not shown) perform similar functions to those described above.

In one embodiment, the 10 percent output of splitter $1104_{N-1}$ is directed to an optical sensor 1108N which produces a narrow band output centered at frequency $\lambda_N$ representative of a measurement made by optical sensor $1108_N$. In one embodiment, that output is directed to an optical combiner $1110_N$, where it is combined with the output of optical combiner $1110_{N-1}$ (not shown). The 10 percent output of splitter $1104_N$ is delayed by time delay $1106_{N-1}$, causing the $\lambda_N$ signal to be time multiplexed with the optical outputs of the other optical sensors $1108_{1...N}$.

In one embodiment, the output of optical combiner $1110_N$, which contains the frequency and time multiplexed optical signals described above, proceeds through a fiber U-turn 1114 to a return fiber 1116 and ultimately to the processor 130, 224, where the frequency and time multiplexed signals are extracted and processed.

Figure 12:
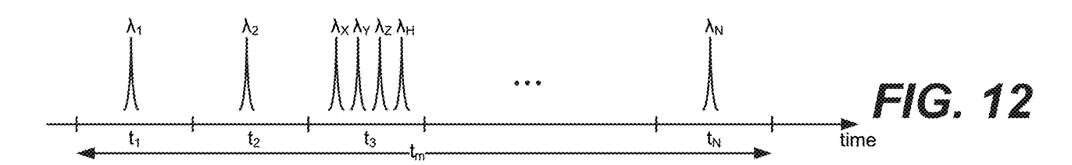
FIG. 12 illustrates a measurement cycle for time and frequency multiplexed optical sensors.

In one embodiment, illustrated in FIG. 12 for a single measurement cycle $t_m$, the signal returned on the return fiber 1116 includes N time slots, $t_{1...N}$. In one embodiment, the duration of the time slots $t_{1...N}$ and the duration of the single measurement cycle $t_m$ is determined by the time delays $1106_{1...N-1}$. Time slot $t_1$ contains the $\lambda_1$ signal output from optical sensor $1108_1$. Time slot $t_2$ contains the $\lambda_2$ signal output from optical sensor $1108_2$. Time slot $t_3$ contains the $\lambda_X$, $\lambda_X$, $\lambda_Z$, $\lambda_H$, signal output from series-coupled optical sensor $1108_3$. Time slots $t_{4...N-1}$ contain the outputs (not shown) from the optical sensors $1108_{4...N-1}$ (not shown). Time slot $t_N$ contains the $\lambda_N$ signal output from optical sensor $1108_N$. In one embodiment, the time slots $t_{1...N}$ are not as cleanly demarked as shown in FIG. 12 because the signal outputs from the various optical sensors $1108_{1...N}$ are present in overlapping intervals on either side of the boundaries between the time slots $t_{1...N}$. That is, for example, the signal output from optical sensor $1108_1$ may be present for the first part of interval $t_2$, potentially interfering with the signal output from optical sensor $1108_2$ for the overlapping time. In one embodiment, the processor 130, 224 takes samples at the center of the time slots $t_{1...N}$ to avoid the overlapping intervals where interference is possible.

Figure 13:
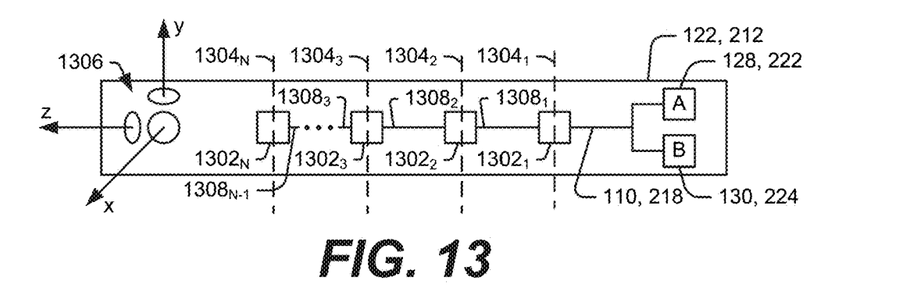
FIGS. 13-16 are block diagrams of downhole logging tools with optical sensors.

In one embodiment, illustrated in FIG. 13, a downhole logging tool 122, 212 includes N optical sensors $1302_{1...N}$, such as optical sensor 124, 214, to sense electromagnetic fields related to formation parameters at a respective locations $1304_{1...N}$ along the downhole logging tool 122, 212. In one embodiment, the light source 128, 222 transmits light to the optical sensors $1302_{1...N}$ by way of the fiber optic cable 110, 218. In one embodiment, the processor 130, 224 receives light from the optical sensors $1302_{1...N}$ by way of the fiber optic cable 110, 218, processes the received light, and provides an evaluation of the formation parameter.

In one embodiment, an electromagnetic ("EM") field generating source 1306 generates an electromagnetic field that interacts with the outside formation and is then received by the optical sensors $1302_{1...N}$. The received electromagnetic field is modified by the formation and as a result contains information in regards to the electrical and magnetic properties of the formation. Such properties of the formation includes resistivity, electric permittivity and magnetic permeability of formation layers, shape of formation layer boundaries and distance to formation layer boundaries. Parameters of the formation can be obtained from the received electromagnetic signal by a process called inversion where obtained signal data is compared with the data from an electromagnetic simulation based on a set of selected formation parameters. The selected formation parameter set which produces the closest signal to the signal data is chosen as the solution. In one embodiment, the EM field generating source 1306 is a solenoid type of source. In one embodiment, the EM field generating source 1306 is a triad that generates electromagnetic fields in three orientations. In one embodiment the three orientations are perpendicular to each other.

In one embodiment, the EM field generating source 1306 is a triad and the optical sensors $1302_{1...N}$ are able to measure in three directions, in one embodiment three mutually orthogonal directions. In one embodiment, this is accomplished by using a fiber optic cable 110, 218 and $1308_{1...N}$ having a different fiber for each of the different orientations or by the use of mirrors (not shown) that can change the direction of propagation of the laser beam.

In one embodiment, the EM field generating source 1306 is located within the downhole logging tool 122, 212. In one embodiment, the EM field generating source 1306 is located outside the downhole logging tool 122, 212. In one embodiment, the EM field generating source 1306 is located outside the wellbore 112, 206. In one embodiment, the EM field generating source 1306 is located in a different well (not shown).

In one embodiment, the fiber optic cable 110, 218, includes an input fiber, such as input fiber 1103 (FIG. 11), and a return fiber, such as return fiber 1116 (FIG. 11), and the light source 128, 222 and the processor 130, 224 are on the same side of the optical sensors $1302_{1...N}$.

In one embodiment, the light source 128, 222 and the processor 130, 224 are located in the same housing as the downhole logging tool 122, 212. In one embodiment, such as that shown in FIGS. 1 and 2, the light source 128, 222 and the processor 130, 224 are located outside the downhole logging tool 122, 212. In one embodiment, the light source 128, 222 and the processor 130, 224 are located at the surface. In one embodiment, the light source 128, 222 is located at the surface and the processor 130, 224 is located within the housing of the downhole logging tool 122, 212. In one embodiment, the light source 128, 222 is located in the housing of the downhole logging tool 122, 212 and the processor 130, 224 is located on the surface.

In one embodiment, the optical sensors $1302_{1...N}$ are connected by respective fiber optic cables $1308_{1...N}$. That is, optical sensor $1302_1$ is coupled to optical sensor $1302_2$ by fiber optic cable $1308_1$, optical sensor $1302_2$ is coupled to optical sensor $1302_3$ by fiber optic cable $1308_2$, optical sensor $1302_3$ is coupled to optical sensor $1302_4$ (not shown) by fiber optic cable $1308_3,...$, and optical sensor $1302_{N-1}$ (not shown) is coupled to optical sensor $1302_N$ by fiber optic cable $1308_{N-1}$.

In one embodiment, the fiber optic cables $1308_{1...N}$ are coupled to the fiber optic cable 110, 218, by optical splitters $1104_{1...N}$, time delays $1106_{1...N}$, and optical combiners $1110_{1...N}$, as shown in FIG. 11.

In one embodiment, the fiber optic cables $1308_{1...N}$ includes input fibers and return fibers, such as those shown in FIG. 11.

Figure 14:
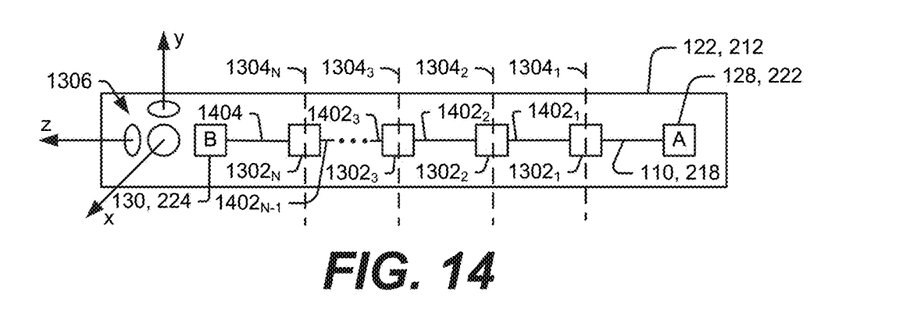

In one embodiment similar to that in FIG. 13, illustrated in FIG. 14, light source 128, 222 is located on the opposite side of the optical sensors $1302_{1...N}$ from the processor 130, 224. In one embodiment, the optical sensors $1302_{1...N}$ are connected by respective fiber optic cables $1402_{1...N}$. That is, optical sensor $1302_1$ is coupled to optical sensor $1302_2$ by fiber optic cable $1402_1$, optical sensor $1302_2$ is coupled to optical sensor $1302_3$ by fiber optic cable $1402_2$, optical sensor $1302_3$ is coupled to optical sensor $1302_4$ (not shown) by fiber optic cable $1402_3,...N$, and optical sensor $1302_{N-1}$ (not shown) is coupled to optical sensor $1302_N$ by fiber optic cable $1402_{N-1}$.

In one embodiment, the fiber optic cables $1402_{1...N}$ do not include return fibers.

Figure 15:
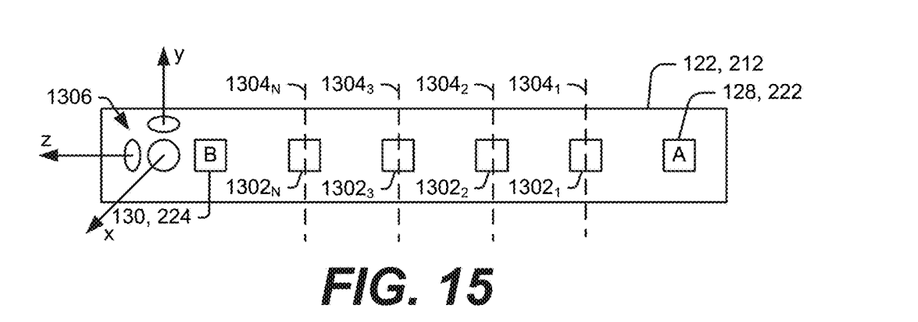

In one embodiment similar to that in FIG. 14, illustrated in FIG. 15, the optical sensors $1302_{1...N}$ are not connected by fiber optic cable. In one embodiment, the light travels between the optical sensors $1302_{1...N}$ through free space within the housing of the downhole logging tool 122, 212.

Figure 16:
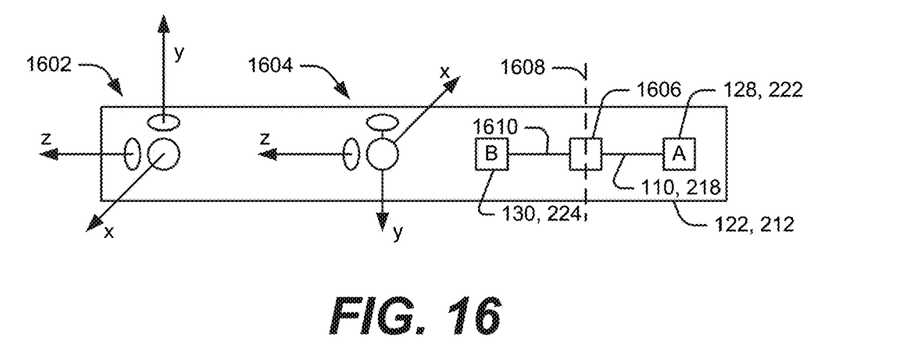

In one embodiment, illustrated in FIG. 16, more than one EM source transmitting at a same frequency are used to cancel the direct field in order to more accurately measure the field scattered by the formation 126, 216. In one embodiment, the downhole logging tool 122, 212, includes a first EM field generating source 1602 and a second EM field generating source 1604. In one embodiment, the first EM field generating source 1602 and the second EM field generating source 1604 are made from the same wire so that they share the same current when generating their respective fields. In one embodiment, the fields generated by the first EM field generating source 1602 are opposite those generated by the second EM field generating source 1604, as indicated in FIG. 16 by the opposite directions of the axes associated with the first and second EM field generating sources 1602, 1604. In one embodiment, an optical sensor 1606, such as optical sensor 124, 214, is placed at a position 1608 where the direct fields of the first EM field generating source 1602 and the second EM field generating source 1604 cancel, which enhances the ability of the optical sensor 1606 to detect the electromagnetic field scattered from the formation 126, 216, which can be orders of magnitude smaller than the direct field. In one embodiment, the first EM field generating source 1602 and the second EM field generating source 1604 are placed on the same of the optical sensor 1606, as shown in FIG. 16. In one embodiment, the first EM field generating source 1602 and the second EM field generating source 1604 are placed on opposite sides of the optical sensor 1606.

In one embodiment, the EM field generating source 1306 is located at a first location and a second EM field generating source (not shown) is located at a second location different from the first location. In one embodiment, the first EM field generating source 1306 and the second EM field generating source (not shown) operate sequentially, with only one active at any time.

In one embodiment, the first EM field generating source generates a first electromagnetic field at a first frequency, the second EM field generating source generates a second electromagnetic field at a second frequency different from the first frequency, and the first electromagnetic field generating source and second electromagnetic field generating source operate simultaneously.

In one embodiment, the light source 128, 222 is coupled to the optical sensor 1606 by the fiber optic cable 110, 218. In one embodiment, the optical sensor is coupled to the processor 130, 224 by a fiber optic cable 1610.

In one embodiment, an array of optical sensors $1304_{1...N}$, such as that shown in FIGS. 13-15, or optical sensor 1606 shown in FIG. 16, could be used to make measurements related to parameters, such as resistivity, at a range of depths of investigation into formation 126, 216, where the depth of investigation depends on the distance between the EM field generating source 1306 and the various optical sensors $1304_{1...N}$. In one embodiment, the formation parameters are used to determine characteristics of the formation 126, 216, such as whether the formation 126, 216 contains producible hydrocarbons. In one embodiment, such information can be used to make decisions about a well, such as whether to attempt to produce from the formation 126, 216.

Figure 17:
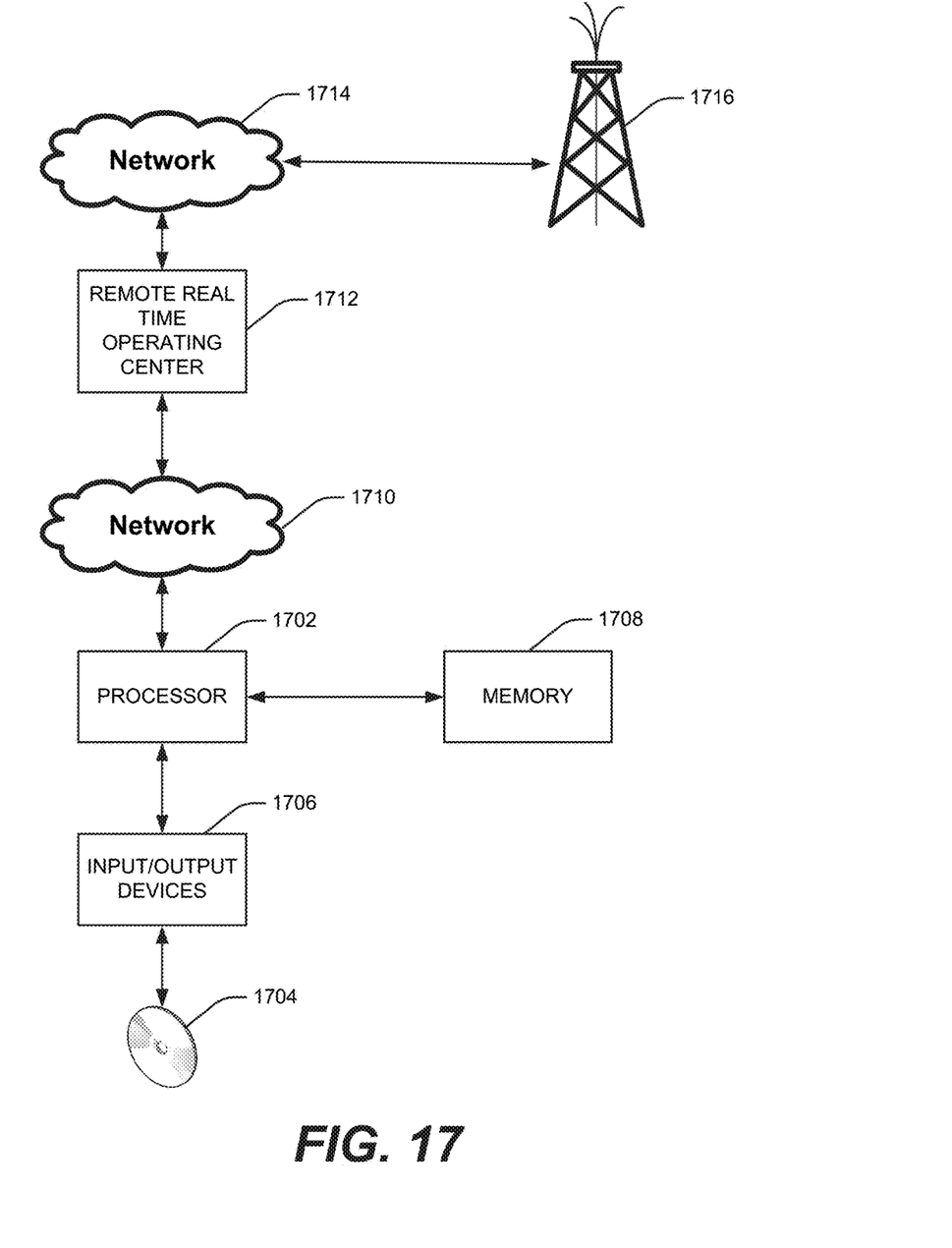
FIG. 17 illustrates the data flow in real time and memory operation.

In one embodiment, shown in FIG. 17, the data gathering system 106, 220 is programmed with software in the form of a computer program on a non-transitory computer readable media 1704, such as a CD, a DVD, a USB drive, a portable hard drive or other portable memory. In one embodiment, the data gathering system 106, 220 reads the computer program from the computer readable media 1704 through an input/output device 1706 and stores it in a memory 1708 where it is prepared for execution through compiling and linking, if necessary, and then executed. In one embodiment, the system accepts inputs through an input/output device 1706, such as a keyboard or keypad, mouse, touchpad, touch screen, etc., and provides outputs through an input/output device 1706, such as a monitor or printer. In one embodiment, the system stores the results of calculations in memory 1708 or modifies such calculations that already exist in memory 1708.

In one embodiment, the results of calculations that reside in memory 1708 are made available through a network 1710 to a remote real time operating center 1712. In one embodiment, the remote real time operating center 1712 makes the results of calculations available through a network 1714 to help in the planning of oil wells 1716 or in the drilling of oil wells 1716.

The word "coupled" herein means a direct connection or an indirect connection.

The text above describes one or more specific embodiments of a broader invention. The invention also is carried out in a variety of alternate embodiments and thus is not limited to those described here. The foregoing description of an embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An apparatus comprising:
   a downhole logging tool comprising a first optical sensor to sense a field related to a formation parameter at a first location along the downhole logging tool; and
   a processor that receives an optical sensor output from the first optical sensor and provides an evaluation of the formation parameter;
   wherein the processor is contained in the downhole logging tool.

2. The apparatus of claim 1 wherein the optical sensor output has a frequency that depends on a measurement of the sensed formation parameter.

3. The apparatus of claim 1 further comprising:
   a second optical sensor contained in the downhole logging tool to sense a field related to the formation parameter at a second location along the downhole logging tool wherein the second location is different from the first location.

4. The apparatus of claim 3 wherein light from the first optical sensor passes to the second optical sensor via an optical fiber.

5. The apparatus of claim 1 further comprising a light source.

6. The apparatus of claim 5 wherein:
   the light source is contained in the downhole logging tool.

7. A system comprising:
   a light source;
   a downhole logging tool comprising a first optical sensor that receives a source light from the light source and provides a first optical sensor output having a first frequency spectrum that depends on a formation parameter adjacent to a first location on the downhole logging tool; and
   a processor that receives and processes the first optical sensor output to provide an evaluation of the formation parameter;
   wherein the processor is contained in the downhole logging tool.

8. The system of claim 7 further comprising:
   a second optical sensor contained in the downhole logging tool that receives the source light from the light source and provides a second optical sensor output having a second frequency spectrum that depends on a formation parameter adjacent to a second location on the downhole logging tool wherein the second location is different from the first location.

9. The system of claim 7 further comprising a first electromagnetic field generating source to stimulate an electromagnetic field which the first optical sensor detects to produce the first optical sensor output.

10. The system of claim 9 wherein the first electromagnetic field generating source generates a first electromagnetic field at a first frequency and at a first field direction, the system further comprising:
    a second electromagnetic field generating source that generates a second electromagnetic field at the first frequency and at a second field direction opposite the first field direction wherein the second electromagnetic field generating source is located relative to the first electromagnetic field generating source such that the second electromagnetic field cancels the first electromagnetic field at a direct field cancellation point; and
    wherein the first optical sensor is located at the direct field cancellation point.

11. The system of claim 9 wherein:
    the first electromagnetic field generating source generates multiple electromagnetic fields having different orientations.

12. The system of claim 9 wherein the first electromagnetic field generating source is located at a first location and the system further comprises a second electromagnetic field generating source located at a second location different from the first location.

13. The system of claim 12 wherein the first electromagnetic field generating source and the second electromagnetic field generating source operate sequentially, with only one active at any time.

14. The system of claim 12 wherein:
    the first electromagnetic field generating source generates a first electromagnetic field at a first frequency;
    the second electromagnetic field generating source generates a second electromagnetic field at a second frequency different from the first frequency; and
    the first electromagnetic field generating source and second electromagnetic field generating source operate simultaneously.

15. A method comprising:
    deploying a downhole logging tool in a well adjacent to a formation;
    transmitting a source light from a light source to a first optical sensor contained in the downhole logging tool, wherein the source light includes a first source component having a first source frequency spectrum;
    the first optical sensor transmitting a first optical sensor output light derived from the first source component of the source light and having a first optical sensor frequency spectrum different from the first source frequency spectrum of the first source component by an amount that depends on a parameter of the formation being measured by the first optical sensor;
    a processor receiving the first optical sensor output light; and
    the processor processing the first optical sensor output light to estimate the parameter being measured by the first optical sensor;
    wherein the processor is contained in the downhole logging tool.

16. The method of claim 15 further comprising:
    inducing an electromagnetic field related to the parameter being measured by the first optical sensor causing the first optical sensor to derive the first optical sensor output light from the first source component of the source light.

17. The method of claim 15 further comprising:
    transmitting the source light from the light source to a second optical sensor contained in the downhole logging tool, wherein the source light includes a second source component at a second source frequency spectrum;

the second optical sensor transmitting a second optical sensor output light derived from the second source component of the source light and having a second optical sensor frequency spectrum different from the second source frequency spectrum of the second source component by an amount that depends on a parameter of the formation being measured by the second optical sensor;

the processor receiving the second optical sensor output light; and the processor processing the second optical sensor output light to estimate the parameter being measured by the second optical sensor.

18. The method of claim 17 further comprising:

coupling the first optical sensor to the second optical sensor by an optical fiber.

19. The method of claim 15 further comprising:

locating the light source in the downhole logging tool.

\* \* \* \* \*

UNITED STATES PATENT AND TRADEMARK OFFICE
CERTIFICATE OF CORRECTION

PATENT NO. : 10,025,001 B2
APPLICATION NO. : 15/038121
DATED : July 17, 2018
INVENTOR(S) : Luis E. San Martin, Etienne Marcel Samson and Burkay Donderici Page 1 of 1

It is certified that error appears in the above-identified patent and that said Letters Patent is hereby corrected as shown below:

On the Title Page

Item (12) "Martin" should read --San Martin et al.--.

Item (72) Inventors, first inventor, name "E. San Martin" corrected to be "Luis E. San Martin.".

Signed and Sealed this
Eleventh Day of December, 2018

Andrei Iancu
*Director of the United States Patent and Trademark Office*